United States Patent
Shin et al.

(10) Patent No.: US 11,118,844 B2
(45) Date of Patent: Sep. 14, 2021

(54) PREPARATION METHOD FOR HEAT PIPE

(71) Applicant: LG CHEM, LTD., Seoul (KR)

(72) Inventors: Jong Min Shin, Daejeon (KR); Dong Woo Yoo, Daejeon (KR); So Jin Kim, Daejeon (KR)

(73) Assignee: LG CHEM, LTD.

( * ) Notice: Subject to any disclaimer, the term of this patent is extended or adjusted under 35 U.S.C. 154(b) by 0 days.

(21) Appl. No.: 16/604,619

(22) PCT Filed: May 15, 2018

(86) PCT No.: PCT/KR2018/005546
§ 371 (c)(1),
(2) Date: Oct. 11, 2019

(87) PCT Pub. No.: WO2018/212555
PCT Pub. Date: Nov. 22, 2018

(65) Prior Publication Data
US 2020/0158445 A1    May 21, 2020

(30) Foreign Application Priority Data
May 16, 2017 (KR) .................. 10-2017-0060631

(51) Int. Cl.
*F28D 15/04* (2006.01)
*F28D 15/02* (2006.01)
(Continued)

(52) U.S. Cl.
CPC ....... *F28D 15/046* (2013.01); *F28D 15/0233* (2013.01); *B22F 1/0059* (2013.01);
(Continued)

(58) Field of Classification Search
CPC .. B23P 2700/09; Y10T 2700/09; F28D 15/02; F28D 2015/0225; F28D 15/0233; F28D 15/0266; F28D 15/04; F28D 15/043; F28D 15/046; F28F 2255/18; H01L 23/427; H05K 7/20336; B22F 1/0059;
(Continued)

(56) References Cited

U.S. PATENT DOCUMENTS

| 4,885,129 A | 12/1989 | Leonard et al. |
| 2004/0069455 A1 | 4/2004 | Lindemuth et al. |

(Continued)

FOREIGN PATENT DOCUMENTS

| CN | 101848629 | 9/2010 |
| CN | 104296570 | 1/2015 |

(Continued)

OTHER PUBLICATIONS

Translation of DE3015981 (Year: 1981).*
(Continued)

*Primary Examiner* — Matthew P Travers
(74) *Attorney, Agent, or Firm* — Myers Bigel, P.A.

(57) ABSTRACT

Methods for preparing a heat pipe are provided. The methods may include forming a metal foam on a surface of a first metal sheet using a slurry, placing the first metal sheet on a second metal sheet, and bonding outer portions of the first and second metal sheets. The surface of the first metal sheet faces the second metal sheet.

19 Claims, 3 Drawing Sheets

(51) Int. Cl.
*F28F 21/08* (2006.01)
*B22F 1/00* (2006.01)
*B22F 3/11* (2006.01)
*H05K 7/20* (2006.01)

(52) U.S. Cl.
CPC .............. *B22F 3/11* (2013.01); *B22F 3/1125* (2013.01); *B23P 2700/09* (2013.01); *F28D 15/0283* (2013.01); *F28F 21/08* (2013.01); *F28F 2255/18* (2013.01); *F28F 2275/06* (2013.01); *H05K 7/20336* (2013.01)

(58) Field of Classification Search
CPC ...... B22F 2003/1053; B22F 3/11–1103; B22F 3/1125; B22F 2003/1128; B22F 2003/1131; B22F 7/004–006; B22F 2007/047
See application file for complete search history.

(56) References Cited

U.S. PATENT DOCUMENTS

| | | |
|---|---|---|
| 2006/0197245 A1 | 9/2006 | Cheng et al. |
| 2009/0025910 A1* | 1/2009 | Hoffman .............. H01L 23/427 165/104.26 |
| 2009/0026952 A1 | 1/2009 | Ahn |
| 2009/0269521 A1 | 10/2009 | Tuma |
| 2018/0010861 A1 | 1/2018 | Wakaoka et al. |

FOREIGN PATENT DOCUMENTS

| | | | |
|---|---|---|---|
| CN | 105960150 | 9/2016 | |
| DE | 3015981 A1 * | 11/1981 | ............. B22F 3/105 |
| JP | H09-119789 | 5/1997 | |
| JP | 3045491 | 3/2000 | |
| JP | 2002-022378 | 1/2002 | |
| JP | 2002213887 A | 7/2002 | |
| JP | 2004238672 A | 8/2004 | |
| JP | 2009092344 | 4/2009 | |
| KR | 100394309 | 8/2003 | |
| KR | 101206150 | 11/2012 | |
| KR | 20150142787 | 12/2015 | |
| WO | 2006/007721 | 1/2006 | |
| WO | WO-2009049397 A1 * | 4/2009 | ........... F28D 15/046 |
| WO | 2016/151916 | 9/2016 | |
| WO | 2017056842 A1 | 4/2017 | |

OTHER PUBLICATIONS

Translation of JPH09119789A (Year: 1997).*
Translation of KR20120037110A (equivalent to KR101206150) (Year: 2012).*
International Search Report corresponding to PCT/KR2018/005546 (dated Aug. 13, 2018) (5 pages with English translation).
Extended European Search Report corresponding to EP 18803147.0; dated Apr. 29, 2020 (6 pages).

* cited by examiner

PREPARATION METHOD FOR HEAT PIPE

CROSS REFERENCE TO RELATED APPLICATIONS

This application is a 35 U.S.C. § 371 national stage application of PCT International Application No. PCT/KR2018/005546, filed May 15, 2018, which claims priority from Korean Patent Application No. 10-2017-0060631, filed May 16, 2017, the contents of which are incorporated herein in their entireties by reference. The above-referenced PCT International Application was published in the Korean language as International Publication No. WO 2018/212555 on Nov. 22, 2018.

Technical Field

The present application relates to a method for preparing a heat pipe.

BACKGROUND ART

With miniaturization or integration of electronic devices and information devices, the frequency that heat generated upon operation of the electronic devices causes deterioration of performance and malfunction of the electronic devices is increasing.

In order for heat dissipation materials included in highly miniaturized and integrated electronic devices and information devices to exhibit excellent heat dissipation performance, the relevant materials themselves must be capable of implementing high heat dissipation performance even at very thin thicknesses.

Usually, composite materials imparting heat dissipation performance by adding various thermally conductive fillers to a polymer matrix having excellent moldability have been developed, but such composite materials have a limitation in realizing a thin thickness as well as low heat dissipation efficiency.

As another heat dissipation material, there is a material referred to as a so-called heat pipe. The heat pipe is typically implemented with an outer tube, an intermediary body (wick) therein, and an inner fluid migration passage. Such a heat pipe has excellent heat dissipation efficiency as compared to conventional materials, but there is a problem that it is very difficult to realize a heat pipe with a thin thickness and it is difficult to set the condensed fluid so that it can move quickly through the inner fluid passage.

DISCLOSURE

Technical Problem

The present application provides a method for preparing a heat pipe. It is an object of the present invention to provide a preparation method capable of preparing a heat pipe having excellent heat dissipation efficiency through a simple process and forming a heat pipe having a thin thickness when necessary.

Technical Solution

Among physical properties mentioned in this specification, when the measured temperature affects relevant physical properties, the physical properties are physical properties measured at room temperature, unless otherwise specified.

In the present application, the term room temperature is a natural temperature without being heated or cooled, which may be, for example, any temperature in a range of 10° C. to 30° C., or a temperature of about 23° C. or about 25° C. or so.

The heat pipe preparation method of the present application comprises steps of forming a metal foam on a metal sheet (first metal sheet) by using a specific metal-containing slurry, and placing it opposite another metal sheet (second metal sheet) and then bonding peripheral parts. Upon the opposed arrangement, the metal foam formed on the first metal sheet may face the second metal sheet. If necessary, the metal foam may also be formed on the second metal sheet.

Here, in the method of forming the metal foam, the metal foam may be formed, for example, by forming a metal foam precursor using the slurry on a metal sheet and sintering it. Here, the slurry may at least comprise, for example, metal powder, a binder and a dispersant, and in one example, this slurry may be coated on a metal sheet to form the metal foam precursor. At this time, the metal foam precursor can be formed in the central part of the metal sheet so that the peripheral part of the metal sheet has a region capable of being bonded in a bonding process to be described below. Such a metal foam precursor may be sintered to form a metal foam integrated with the metal sheet.

In the case of forming a metal foam even on the second metal sheet, the metal foam may be formed in the same manner as the case of the first metal sheet, and may also be formed in a different manner, if necessary.

The bonding of the peripheral parts in the first and second metal sheets may be formed in such a manner that the first and second metal sheets are opposed to each other and the peripheral parts to be bonded are welded.

By comprising such preparation steps, the heat pipe preparation method of the present application can provide a heat pipe, in which the pore size and the porosity of the metal foam layer constituting the intermediary body (wick) and/or the interior of the heat pipe are suitably maintained, and the heat dissipation efficiency is secured even at a thin thickness, in a simple process.

In the present application, the term metal foam or metal skeleton means a porous structure comprising a metal as a main component. Here, the metal as a main component means that the ratio of the metal is 55 wt % or more, 60 wt % or more, 65 wt % or more, 70 wt % or more, 75 wt % or more, 80 wt % or more, 85 wt % or more, 90 wt % or more, or 95 wt % or more based on the total weight of the metal foam or the metal skeleton. The upper limit of the ratio of the metal contained as the main component is not particularly limited. For example, the ratio of the metal may be 100 wt % or less, or less than about 100 wt %.

The term porous property may mean a case where porosity is 30% or more, 40% or more, 50% or more, 60% or more, 70% or more, 75% or more, or 80% or more. The upper limit of the porosity is not particularly limited, and may be, for example, less than about 100%, about 99% or less, or about 98% or less or so. Here, the porosity can be calculated in a known manner by calculating the density of the metal foam or the like.

In the present application, the method of forming a metal foam on a meta sheet may comprise a step of sintering a metal foam precursor comprising a metal component. In the present application, the term metal foam precursor means a structure before the process performed to form the metal foam, such as the sintering process, that is, a structure before the metal foam is formed. In addition, even when the metal foam precursor is referred to as a porous metal foam precursor, it is not necessarily porous per se, and may be referred to as a porous metal foam precursor for convenience, if it can finally form a metal foam, which is a porous metal structure.

In the present application, the metal foam precursor may be formed using a slurry containing at least a metal component, a dispersant, and a binder.

By applying such a slurry, characteristics, such as pore size and porosity, of the metal foam, can be freely controlled, the metal foam can be prepared in the form of films or sheets which have conventionally been difficult to produce, particularly the form of thin films or sheets as well, and a metal foam layer having excellent other physical properties such as mechanical strength can be formed on a metal sheet with excellent adhesion.

As the metal component, metal powder may be applied. An example of the applicable metal powder is determined depending on purposes, which is not particularly limited, but it can be exemplified by any one powder selected from the group consisting of copper powder, molybdenum powder, silver powder, platinum powder, gold powder, aluminum powder, chromium powder, indium powder, tin powder, magnesium powder, phosphorus powder, zinc powder and manganese powder, metal powder mixed with two or more of the foregoing or a powder of an alloy of two or more of the foregoing, without being limited thereto.

If necessary, the metal component may comprise, as an optional component, a metal component having relative magnetic permeability and conductivity in a predetermined range. Such a metal component can be helpful in selecting an induction heating method in a sintering process. However, since the sintering does not necessarily have to proceed by the induction heating method, the metal component having the above magnetic permeability and conductivity is no essential component.

In one example, as the metal powder which can be optionally added, metal powder having relative magnetic permeability of 90 or more may be used. The term relative magnetic permeability ($\mu_r$) is a ratio ($\mu/\mu_0$) of the magnetic permeability ($\mu$) of the relevant material to the magnetic permeability ($\mu_0$) in the vacuum. In another example, the relative magnetic permeability may be 95 or more, 100 or more, 110 or more, 120 or more, 130 or more, 140 or more, 150 or more, 160 or more, 170 or more, 180 or more, 190 or more, 200 or more, 210 or more, 220 or more, 230 or more, 240 or more, 250 or more, 260 or more, 270 or more, 280 or more, 290 or more, 300 or more, 310 or more, 320 or more, 330 or more, 340 or more, 350 or more, 360 or more, 370 or more, 380 or more, 390 or more, 400 or more, 410 or more, 420 or more, 430 or more, 440 or more, 450 or more, 460 or more, 470 or more, 480 or more, 490 or more, 500 or more, 510 or more, 520 or more, 530 or more, 540 or more, 550 or more, 560 or more, 570 or more, 580 or more, or 590 or more. The upper limit of the relative magnetic permeability is not particularly limited because the higher the value is, the more advantageous it is in the case where the induction heating is applied. In one example, the upper limit of the relative magnetic permeability may be, for example, about 300,000 or less.

The metal powder that can be optionally added may also be conductive metal powder. In the present application, the term conductive metal powder may mean a powder of a metal or an alloy thereof having conductivity at 20° C. of about 8 MS/m or more, 9 MS/m or more, 10 MS/m or more, 11 MS/m or more, 12 MS/m or more, 13 MS/m or more, or 14.5 MS/m. The upper limit of the conductivity is not particularly limited, and for example, may be about 30 MS/m or less, 25 MS/m or less, or 20 MS/m or less.

In the present application, the metal powder having the relative magnetic permeability and conductivity may also be simply referred to as conductive magnetic metal powder.

A specific example of such conductive magnetic metal powder can be exemplified by a powder of nickel, iron or cobalt, and the like, but is not limited thereto.

If used, the ratio of the conductive magnetic metal powder in the entire metal powder is not particularly limited. For example, the ratio may be adjusted so that the ratio may generate appropriate Joule heat upon the induction heating. For example, the metal powder may comprise 30 wt % or more of the conductive magnetic metal powder based on the weight of the entire metal powder. In another example, the ratio of the conductive magnetic metal powder in the metal powder may be about 35 wt % or more, about 40 wt % or more, about 45 wt % or more, about 50 wt % or more, about 55 wt % or more, 60 wt % or more, 65 wt % or more, 70 wt % or more, 75 wt % or more, 80 wt % or more, 85 wt % or more, or 90 wt % or more. The upper limit of the conductive magnetic metal powder ratio is not particularly limited, and may be, for example, less than about 100 wt %, or 95 wt % or less. However, the above ratios are exemplary ratios.

The size of the metal powder is also selected in consideration of the desired porosity or pore size, and the like, but is not particularly limited, where the metal powder may have an average particle diameter, for example, in a range of about 0.1 μm to about 200 μm. In another example, the average particle diameter may be about 0.5 μm or more, about 1 μm or more, about 2 μm or more, about 3 μm or more, about 4 μm or more, about 5 μm or more, about 6 μm or more, about 7 μm or more, or about 8 μm or more. In another example, the average particle diameter may be about 150 μm or less, 100 μm or less, 90 μm or less, 80 μm or less, 70 μm or less, 60 μm or less, 50 μm or less, 40 μm or less, 30 μm or less, or 20 μm or less. As the metal in the metal particles, one having different average particle diameters may also be applied. The average particle diameter can be selected from an appropriate range in consideration of the shape of the desired metal foam or heat pipe, for example, the thickness or porosity of the metal foam, and the like. The pore size of the metal foam is in a range of 100 nm to 100 μm.

Here, the average particle diameter of the metal powder may be obtained by a known particle size analysis method, and for example, the average particle diameter may be a so-called D50 particle diameter.

The ratio of the metal component (metal powder) in the slurry as above is not particularly limited, which may be selected in consideration of the desired viscosity and process efficiency. In one example, the ratio of the metal component in the slurry may be 0.5 10 to 95% or so on the basis of weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less, about 80% or less, about 75% or less, about 70% or less, about 65% or less, 60% or less, 55% or less, 50% or less, 45% or less, 40% or less, 35% or less, 30% or less, 25% or less, 20% or less, 15% or less, 10% or less, or 5% or less, but is not limited thereto.

The metal foam precursor may be formed by using a slurry comprising a dispersant and a binder together with the metal powder.

Here, as the dispersant, for example, an alcohol may be applied. As the alcohol, a monohydric alcohol having 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol, or terpineol, or a dihydric alcohol having 1 to 20 carbon atoms such as ethylene glycol, propylene glycol, hexane diol, octane diol or pentane diol, or a polyhydric alcohol, etc., may be used, but the kind is not limited to the above.

The slurry may further comprise a binder. The kind of the binder is not particularly limited, and may be appropriately selected depending on the kind of the metal component or the dispersant, and the like applied at the time of producing the slurry. For example, the binder may be exemplified by alkyl cellulose having an alkyl group having 1 to 8 carbon atoms such as methyl cellulose or ethyl cellulose, polyalkylene carbonate having an alkylene unit having 1 to 8 carbon atoms such as polypropylene carbonate or polyethylene carbonate, or a polyvinyl alcohol-based binder (hereinafter, may be referred to as a polyvinyl alcohol compound) such as polyvinyl alcohol or polyvinyl acetate, and the like, but is not limited thereto.

The ratio of each component in the slurry as above is not particularly limited. This ratio can be adjusted in consideration of process efficiency such as coating property and moldability upon a process of using the slurry.

For example, in the slurry, the binder may be included in a ratio of about 1 to 500 parts by weight relative to 100 parts by weight of the above-described metal component. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, or about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 50 parts by weight or less, about 40 parts by weight or less, about 30 parts by weight or less, about 20 parts by weight or less, or about 10 parts by weight or less.

In the slurry, the dispersant may be contained at a ratio of about 10 to 2,000 parts by weight relative to 100 parts by weight of the binder. In another example, the ratio may be about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 200 parts by weight or more, about 300 parts by weight or more, about 400 parts by weight or more, about 500 parts by weight or more, about 550 parts by weight or more, about 600 parts by weight or more, or about 650 parts by weight, and may be about 1,800 parts by weight or less, about 1,600 parts by weight or less, about 1,400 parts by weight or less, about 1,200 parts by weight or less, or about 1,000 parts by weight or less.

In this specification, the unit part by weight means a weight ratio between the respective components, unless otherwise specified.

The slurry may further comprise a solvent, if necessary. However, according to one example of the present application, the slurry may not contain the solvent. As the solvent, an appropriate solvent may be used in consideration of solubility of the slurry component, for example, the metal component or the binder, and the like. For example, as the solvent, those having a dielectric constant within a range of about 10 to 120 can be used. In another example, the dielectric constant may be about 20 or more, about 30 or more, about 40 or more, about 50 or more, about 60 or more, or about 70 or more, or may be about 110 or less, about 100 or less, or about 90 or less. Such a solvent may be exemplified by water, an alcohol having 1 to 8 carbon atoms such as ethanol, butanol or methanol, DMSO (dimethyl sulfoxide), DMF (dimethyl formamide) or NMP (N-methylpyrrolidinone), and the like, but is not limited thereto.

When a solvent is applied, it may be present in the slurry at a ratio of about 50 to 400 parts by weight relative to 100 parts by weight of the binder, but is not limited thereto. In another example, the ratio of the solvent may be about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 160 parts by weight or more, about 170 parts by weight or more, about 180 parts by weight or more, or about 190 parts by weight or more, or may be 300 parts by weight or less, or 250 parts by weight or less, but is not limited thereto.

The slurry may also comprise, in addition to the above-mentioned components, known additives which are additionally required. However, the process of the present application may be performed using a slurry comprising no blowing agent among known additives.

The method of forming the metal foam precursor using the slurry as above is not particularly limited. In the field of producing metal foams, various methods for forming the metal foam precursor are known, and in the present application all of these methods can be applied. For example, the metal foam precursor may be formed by holding the slurry in an appropriate template, or by coating the slurry in an appropriate manner.

It may be advantageous to apply a coating process when producing metal foams in the form of films or sheets according to one example of the present application, especially when producing metal foams in the form of thin films or sheets. For example, the desired metal foam may be formed by coating the slurry on a suitable base material to form a precursor, followed by the sintering process to be described below.

In particular, when a metal foam precursor is formed by coating the slurry directly on a metal sheet to form a metal foam layer, the metal foam layer having excellent adhesion to the metal sheet can be formed, thereby preparing a heat pipe having excellent durability.

The shape of such a metal foam precursor is not particularly limited as it is determined depending on the desired metal foam. In one example, the metal foam precursor may be in the form of a film or sheet. For example, when the precursor is in the form of a film or sheet, the thickness may be 2,000 µm or less, 1,500 µm or less, 1,000 µm or less, 900 µm or less, 800 µm or less, 700 µm or less, 600 µm or less, 500 µm or less, 400 µm or less, 300 µm or less, 200 µm or less, 150 µm or less, about 100 µm or less, about 90 µm or less, about 80 µm or less, about 70 µm or less, about 60 µm or less, or about 55 µm or less. Metal foams have generally brittle characteristics due to their porous structural features, so that there are problems that they are difficult to be produced in the form of films or sheets, particularly thin films or sheets, and are easily broken even when they are made. However, according to the method of the present application, it is possible to form a metal foam having pores uniformly formed inside and excellent mechanical properties as well as a thin thickness.

Here, the lower limit of the precursor thickness is not particularly limited. For example, the film or sheet shaped precursor may have a thickness of about 5 µm or more, 10 µm or more, or about 15 µm or more.

If necessary, a suitable drying process may also be performed during a process of forming the metal foam precursor. For example, the metal foam precursor may also be formed by forming the slurry by the above-described coating method or the like and then drying it constant time. The conditions of the drying are not particularly limited and can be controlled, for example, at a level where the solvent contained in the slurry can be removed to a desired level. For example, the drying may be performed by maintaining the formed slurry at a temperature in a range of about 50° C. to 250° C., about 70° C. to 180° C., or about 90° C. to 150° C. for an appropriate time. The drying time can also be selected in an appropriate range.

For the production of the heat pipe, the metal foam precursor or metal foam may be formed on a metal sheet such as a metal substrate. For example, the metal foam precursor can be formed by coating the above-described slurry on a metal sheet and, if necessary, through the above-described drying process. Through such a method, even in the case of a metal foam having a thin thickness, it can be formed on the metal sheet with excellent adhesive force.

The type of the metal sheet is determined depending on purposes, which is not particularly limited, and for example, a base material of the same metal as or the different metal from the metal foam can be applied.

For example, the metal sheet may be a base material of any one metal selected from the group consisting of copper, molybdenum, silver, platinum, gold, aluminum, chromium, indium, tin, magnesium, phosphorus, zinc and manganese, or a base material of a mixture or an alloy of two or more thereof, and if necessary, a base material of any one selected from the group consisting of nickel, iron and cobalt, which are the above-described conductive magnetic metals, or a mixture or alloy of two or more thereof, or a base material of a mixture or alloy of the conductive magnetic metal and the above other metals, and the like may also be used.

The thickness of such a metal sheet is not particularly limited, which may be suitably selected depending on purposes.

The metal foam can be prepared by sintering the metal foam precursor formed in the above manner. In this case, a method of performing the sintering for producing the metal foam is not particularly limited, and a known sintering method can be applied. That is, the sintering can proceed by a method of applying an appropriate amount of heat to the metal foam precursor in an appropriate manner.

In this case, the conditions of the sintering may be controlled, in consideration of the state of the applied metal precursor, for example, the kind and amount of the metal powder, or the kind and amount of the binder or dispersant, and the like, such that while the metal powder is connected to form the porous structure, the binder and the dispersant, and the like may be removed, where the specific conditions are not particularly limited.

For example, the sintering can be performed by maintaining the precursor at a temperature in a range of about 500° C. to 2000° C., in a range of 700° C. to 1500° C., or in a range of 800° C. to 1200° C., and the holding time may also be selected optionally. In one example, the holding time may be in a range of about 1 minute to 10 hours, but is not limited thereto.

As a method different from the existing known method, in the present application, the sintering can be performed by an induction heating method. The induction heating method means that sintering is performed using heat generated by applying an electromagnetic field to the slurry. By such a method, it is possible to smoothly manufacture metal foams having excellent mechanical properties and whose porosity is controlled to the desired level as well as comprising uniformly formed pores.

Here, the induction heating is a phenomenon in which heat is generated from a specific metal when an electromagnetic field is applied. For example, if an electromagnetic field is applied to a metal having a proper conductivity and magnetic permeability, eddy currents are generated in the metal, and Joule heating occurs due to the resistance of the metal. In the present application, a sintering process through such a phenomenon can be performed. In the present application, the sintering of the metal foam can be performed in a short time by applying such a method, thereby ensuring the processability. In addition, a metal sheet comprising a metal foam layer having excellent mechanical strength while having high porosity and excellent mechanical strength can be produced by such a method, whereby a heat pipe having excellent heat dissipation efficiency while having a thin thickness can be produced using such a metal sheet.

When performing the sintering step by the induction heating, the conditions for applying the electromagnetic field are not particularly limited as they are determined depending on the kind and ratio of the conductive magnetic metal particles in the metal foam precursor, and the like. For example, the induction heating can be performed using an induction heater formed in the form of a coil or the like. In addition, the induction heating can be performed, for example, by applying a current of 100 A to 1,000 A or so. In another example, the applied current may have a magnitude of 900 A or less, 800 A or less, 700 A or less, 600 A or less, 500 A or less, or 400 A or less. In another example, the current may have a magnitude of about 150 A or more, about 200 A or more, or about 250 A or more.

The induction heating can be performed, for example, at a frequency of about 100 kHz to 1,000 kHz. In another example, the frequency may be 900 kHz or less, 800 kHz or less, 700 kHz or less, 600 kHz or less, 500 kHz or less, or 450 kHz or less. In another example, the frequency may be about 150 kHz or more, about 200 kHz or more, or about 250 kHz or more.

The application of the electromagnetic field for the induction heating can be performed within a range of, for example, about 1 minute to 10 hours. In another example, the application time may be about 10 minutes or more, about 20 minutes or more, or about 30 minutes or more. In another example, the application time may be about 9 hours or less, about 8 hours or less, about 7 hours or less, about 6 hours or less, about 5 hours or less, about 4 hours or less, about 3 hours or less, about 2 hours or less, about 1 hour or less, or about 30 minutes or less.

The above-mentioned induction heating conditions, for example, the applied current, the frequency and the application time, and the like may be changed in consideration of the kind and the ratio of the conductive magnetic metal particles, as described above.

The sintering step may be performed only by the above-mentioned induction heating, or may also be performed by applying an appropriate heat, together with the induction heating, that is, the application of the electromagnetic field. For example, the sintering step may also be performed by applying an external heat source to the metal foam precursor together with the application of the electromagnetic field or alone.

That is, as described above, the sintering may be controlled, in consideration of the state of the applied metal precursor, for example, the kind and amount of the metal powder, or the kind and amount of the binder or dispersant, and the like, such that while the metal powder is connected to form the porous structure, the binder and the dispersant, and the like may be removed.

A heat pipe can be produced by forming the metal foam on one side of the first metal sheet in the same manner as above, and then placing opposite the first metal sheet, on which the metal foam is formed, and the second metal sheet so that the metal foam on the first metal sheet faces the second metal sheet and bonding the peripheral parts of the first and second metal base materials. A schematic diagram of this process is shown in FIG. 3.

At this time, as shown in FIG. 3, the metal foam may be formed on the surface of the second metal base material facing the first metal base material, where if necessary, the metal foam on the second metal base material may also be formed in the same manner as described above.

The metal foam formed on one side of the metal sheet in the same manner as above can exhibit excellent adhesion to the metal sheet and appropriate pore characteristics (porosity and pore size) even if it is made to have a thin thickness as necessary. FIG. 1 is an example of a metal sheet (10) with attached metal foam as above, which is a view showing a shape that a porous metal structure (12), which is a metal foam, is formed on a metal sheet (11).

The metal foam may have porosity in a range of about 40% to 99%. As mentioned above, according to the method of the present application, porosity and mechanical strength can be controlled, while comprising uniformly formed pores. The porosity may be 50% or more, 60% or more, 70% or more, 75% or more, or 80% or more, or may be 95% or less, or 90% or less. Here, the porosity can be calculated in a known manner by calculating the density of the metal foam.

The metal foam may also be present in the form of thin films or sheets. In one example, the metal foam may be in the form of a film or sheet. The metal foam of such a film or sheet form may have a thickness of 2,000 μm or less, 1,500 μm or less, 1,000 μm or less, 900 μm or less, 800 μm or less, 700 μm or less, 600 μm or less, 500 μm or less, 400 μm or less, 300 μm or less, 200 μm or less, 150 μm or less, about 100 μm or less, about 90 μm or less, about 80 μm or less, about 70 μm or less, about 60 μm or less, or about 55 μm or less. For example, the film or sheet shaped metal foam may have a thickness of about 5 μm or more, about 10 μm or more, about 15 μm or more, about 20 μm or more, about 30 μm or more, about 40 μm or more, about 50 μm or more, about 100 μm or more, about 150 μm or more, about 200 μm or more, about 250 μm or more, about 300 μm or more, about 350 μm or more, about 400 μm or more, about 450 μm or more, or about 500 μm or more.

The metal foam may have excellent mechanical strength, and for example, may have tensile strength of 2.5 MPa or more, 3 MPa or more, 3.5 MPa or more, 4 MPa or more, 4.5 MPa or more, or 5 MPa or more. Also, the tensile strength may be about 10 MPa or less, about 9 MPa or less, about 8 MPa or less, about 7 MPa or less, or about 6 MPa or less. Such tensile strength can be measured, for example, by KS B 5521 at room temperature.

In the heat pipe preparation method of the present application, as illustrated in FIG. 3, the heat pipe can be produced by facing two metal sheets produced in the same manner as above so as to face each other and bonding the peripheral parts of the two metal sheets to form a pipe shape. Here, the bonding method is not particularly limited, and for example, a general metal welding method or the like can be applied.

The pipe-shaped heat pipe can be formed by welding the peripheral parts of the metal sheets faced so that the metal foam layer exists inside. Since the metal sheet formed by the above-described steps has high porosity and small pore size of the metal foam layer, and can be produced in a thin shape, it is possible to provide a heat pipe in a thin shape while having excellent heat dissipation efficiency when welding the peripheral parts of the metal sheets.

In order to form a pipe by welding the peripheral parts of the two metal sheets faced so that the metal foam layer exists inside, the pipe forming step of the present application may further comprise, for example, a step of pressing the peripheral parts of the metal sheets. The method of pressing the peripheral parts of the metal sheets is not particularly limited, where a known method of pressing a metal material can be used. The pipe can be easily formed by welding the metal sheets by a process of pressing their peripheral parts.

The heat pipe preparation method of the present application can provide a heat pipe having a thin thickness, since it produces a heat pipe using thin metal sheets. The above-described drying and sintering steps of the present application can provide a metal sheet in a thin shape while having high porosity and small pore size, and thus, when a heat pipe is produced using the metal sheets as above, a heat pipe having a thin thickness while having excellent heat dissipation performance can be produced. The upper limit of the thickness of the heat pipe of the present application is not particularly limited, but may be, for example, 0.8 mm or less, 0.5 mm or less, or 0.3 mm or less. The lower limit of the thickness of the heat pipe of the present application is not particularly limited, but may be, for example, 0.06 mm or more, 0.08 mm or more, or 0.1 mm or more.

Advantageous Effects

The present application can provide a method for preparing a heat pipe exhibiting excellent heat dissipation characteristics and durability even when formed to a thin thickness as necessary.

MODE FOR INVENTION

Hereinafter, the present application will be described in detail by way of examples and comparative examples, but the scope of the present application is not limited to the following examples.

Example 1

Preparation of First Metal Sheet

Figure 1:
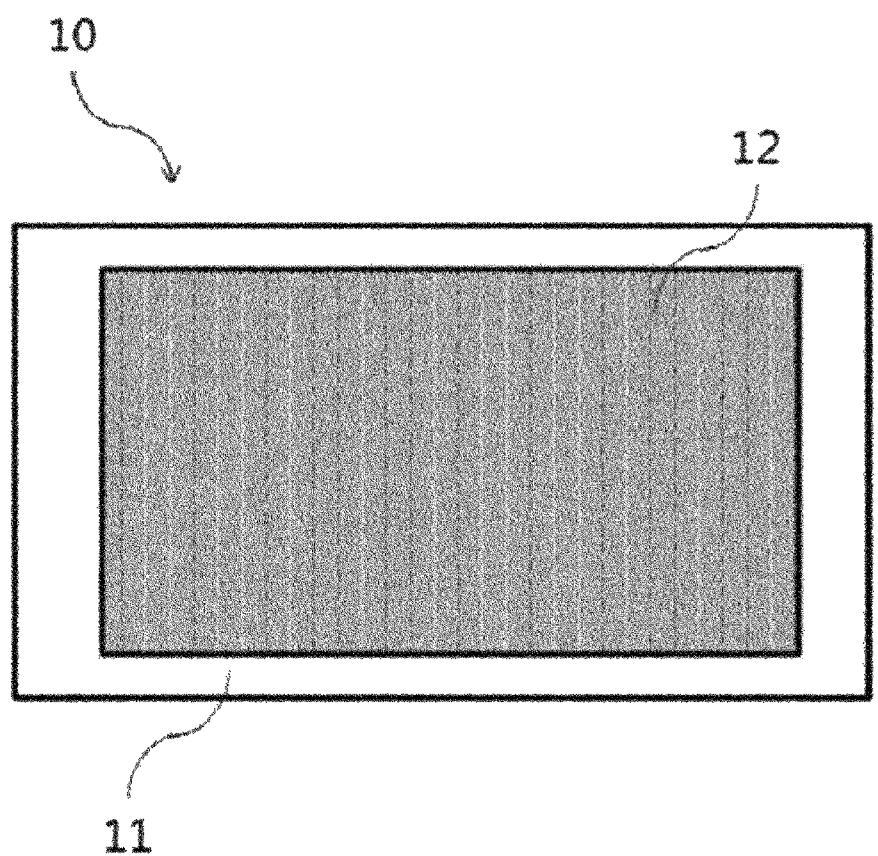
FIG. 1 is a view showing an exemplary shape of a metal foam-attached metal sheet of the present application.
Figure 2:
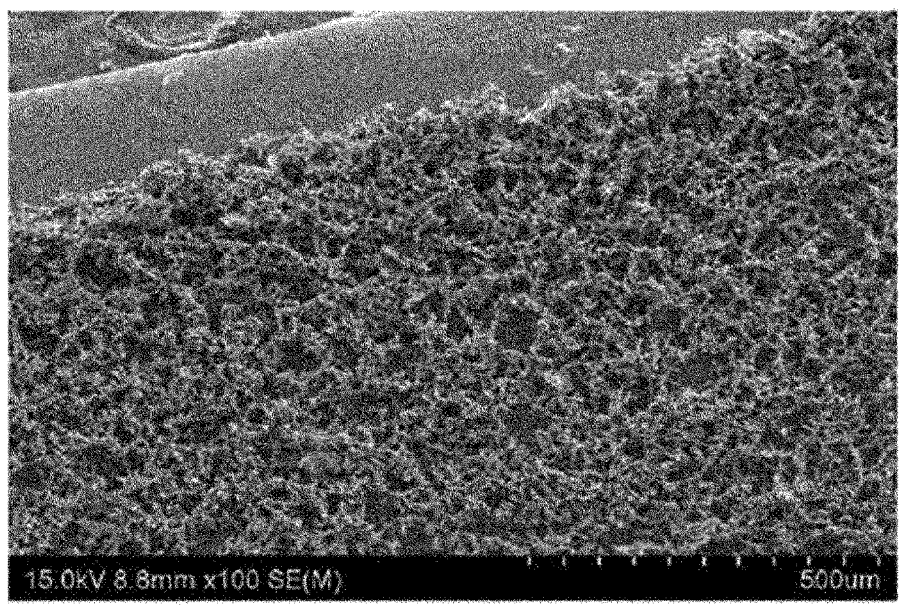
FIG. 2 is a SEM photograph of the metal foam formed in an example.

A slurry was prepared using copper (Cu) powder having an average particle diameter (D50 particle diameter) of about 10 µm to 20 µm as a metal component. The copper powder was mixed with a mixture in which ethylene glycol (EG) as a dispersant and ethyl cellulose (EC) as a binder were mixed in a weight ratio (EG:EC) of 4:5, so that the weight ratio (Cu:EC) of the copper powder to the binder was about 10:1, thereby preparing a slurry. The slurry was coated on a copper base material in the form of a film and dried at about 120° C. for about 1 hour to form a metal foam precursor. At this time, the thickness of the coated metal foam precursor was about 100 The sintering was performed to prepare copper foam by applying an external heat source in an electric furnace so that the precursor was maintained at a temperature of about 1000° C. in a hydrogen/argon gas atmosphere for 2 hours. The porosity of the prepared sheet-shaped copper foam was about 65%. FIG. 2 is a SEM photograph showing a metal foam layer on the copper base material formed as above.

Preparation of Second Metal Sheet

A slurry was prepared in the same manner as in the case of the first metal sheet, except that terpineol was used instead of ethylene glycol as a dispersant and polyvinyl acetate (PVAc) was used instead of ethyl cellulose (EC) as a binder. Upon preparing the slurry, the formulation ratio of the copper powder, the dispersant and the polyvinyl acetate was 1:1:0.1 (Cu:terpineol:PVAc) on the basis of weight. The slurry was coated on a copper base material to a thickness of about 30 µm in a film shape and dried in the same manner as in the case of the first metal sheet to form a metal foam precursor on the copper base material. Subsequently, the sintering was performed under the same conditions as in the case of the first metal sheet to form the copper foam integrated with the copper base material. The porosity of the prepared copper foam was about 68%, which was integrated with the copper substrate with excellent adhesion.

Preparation of Heat Pipe

Figure 3:
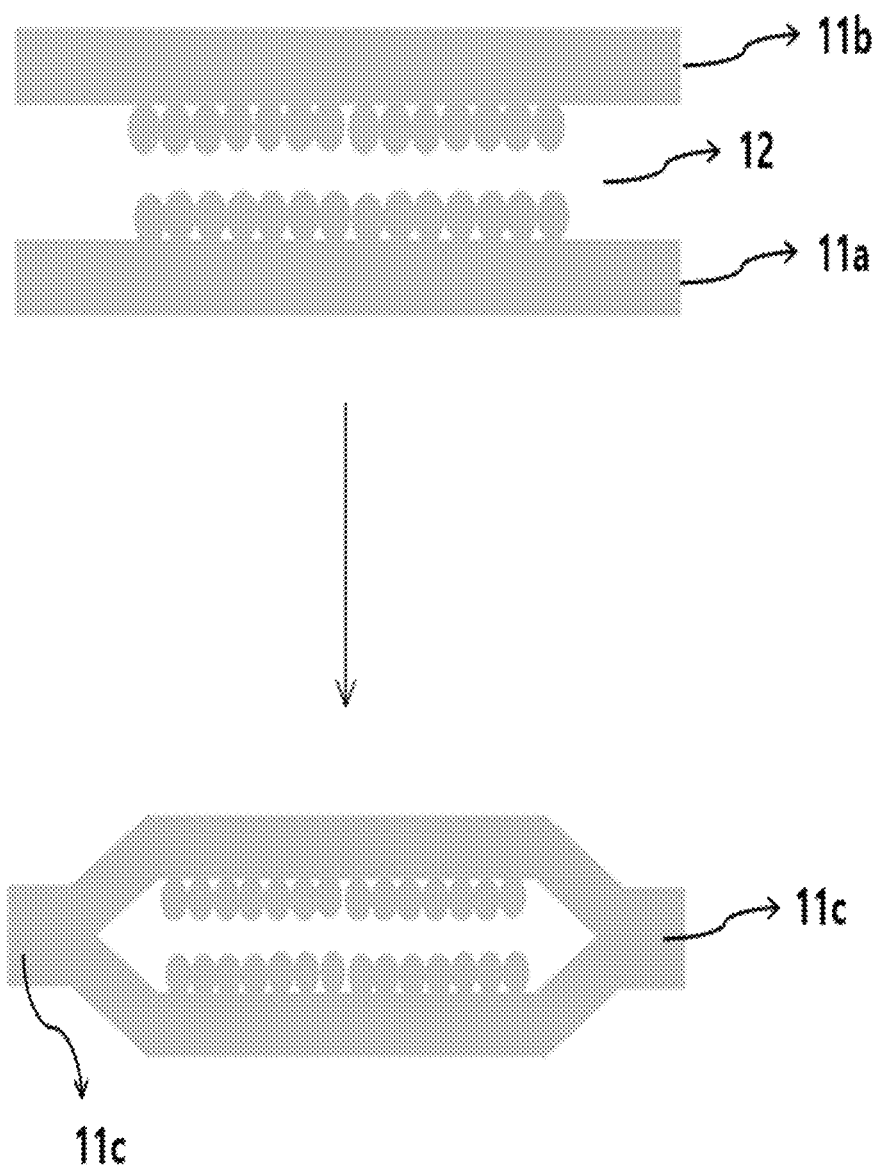
FIG. 3 is a view exemplarily showing a preparation method of the present application.

The first and second metal sheets 11a and 11b as prepared in the above were arranged so that the metal foam layers 12 on their surfaces faced each other, and as shown in FIG. 3, the peripheral parts 11c were press-welded to prepare a heat pipe.

What is claimed is:

1. A method for preparing a heat pipe, the method comprising:
    forming a metal foam directly on a surface of a first metal sheet using a slurry, wherein the slurry comprises metal powder, a binder, and a dispersant;
    placing the first metal sheet on a second metal sheet, wherein the surface of the first metal sheet faces the second metal sheet; and
    bonding outer portions of the first and second metal sheets,
    wherein forming the metal foam directly on the surface of the first metal sheet comprises forming a metal foam precursor on the surface of the first metal sheet by applying the slurry directly onto the surface of the first metal sheet, and
    wherein the slurry is devoid of a blowing agent.

2. The method of claim 1, wherein forming the metal foam directly on the surface of the first metal sheet further comprises sintering the metal foam precursor.

3. The method of claim 2, wherein the metal foam precursor is formed in the form of a film or sheet.

4. The method of claim 2, wherein the sintering is performed at a temperature in a range of 500° C. to 2000° C.

5. The method of claim 2, wherein forming the metal foam precursor comprises coating the slurry on the surface of the first metal sheet, and
    wherein the method further comprises performing a drying process after forming the metal foam precursor and before sintering the metal foam precursor.

6. The method of claim 5, wherein the drying process is performed at a temperature in a range of 50° C. to 250° C.

7. The method of claim 1, wherein the slurry comprises 1 to 500 parts by weight of the binder relative to 100 parts by weight of the metal powder, and 10 to 2,000 parts by weight of the dispersant relative to 100 parts by weight of the binder.

8. The method of claim 1, wherein the metal powder has an average particle diameter in a range of 0.1 µm to 200 µm.

9. The method of claim 1, wherein the binder is alkyl cellulose, polyalkylene carbonate or a polyvinyl alcohol-based binder.

10. The method of claim 1, wherein the dispersant is an alcohol.

11. The method of claim 1, wherein the slurry further comprises a solvent.

12. The method of claim 1, wherein the metal foam comprises a first metal foam, and
    wherein the method further comprises forming a second metal foam directly on a surface of the second metal sheet, wherein the surface of the second metal sheet faces the first metal sheet.

13. The method of claim 1 wherein the metal foam has a porosity in a range of 60% to 99%.

14. The method of claim 1, wherein the metal foam has a pore size in a range of 100 nm to 100 µm.

15. The method of claim 1, wherein the metal foam has a thickness of 500 µm or less.

16. The method of claim 1, wherein the heat pipe has a thickness in a range of 0.06 mm to 0.8 mm.

17. The method of claim 1, wherein the metal powder comprises conductive magnetic metal powder.

18. The method of claim 1, wherein the metal powder comprises at least one of powder of nickel, iron and cobalt.

19. The method of claim 1, wherein the first metal sheet further comprises an inner portion between the outer portions, and
    the metal foam is formed on the inner portion of the first metal sheet and is not formed on the outer portions of the first metal sheet.

* * * * *